United States Patent [19]

Grange et al.

[11] 4,344,983

[45] Aug. 17, 1982

[54] PROCESS AND APPARATUS FOR MANUFACTURING FILAMENTS OF A REFRACTORY MATERIAL BY HIGH-FREQUENCY HEATING

[75] Inventors: André A. Grange, Vert le Petit; Jean A. Corbe, Ballancourt, both of France

[73] Assignee: Societe Nationale des Poudres et Explosifs, Paris, France

[21] Appl. No.: 140,292

[22] Filed: Apr. 14, 1980

[30] Foreign Application Priority Data

Apr. 24, 1979 [FR] France .................................. 79 10334

[51] Int. Cl.³ .............................................. C23C 11/00
[52] U.S. Cl. ..................................... 427/46; 219/61.2
[58] Field of Search ........................... 427/46; 219/61.2

[56] References Cited

U.S. PATENT DOCUMENTS

| | | | |
|---|---|---|---|
| 3,572,286 | 3/1971 | Forney | 427/45.1 |
| 3,754,112 | 8/1973 | DeBolt | 427/46 |
| 4,098,920 | 7/1978 | Miller | 427/46 |

*Primary Examiner*—John H. Newsome
*Attorney, Agent, or Firm*—Bucknam and Archer

[57] ABSTRACT

The present invention concerns the technique for the manufacture of composite materials.

It relates to a process and an apparatus which make it possible continuously to deposit refractory materials, in particular boron, onto a conductive filament heated by means of the Joule effect and by means of a current produced by a high-frequency generator.

It also relates to the apparatus for carrying out the said process.

This new process has the advantage that it makes it possible, in particular, to obtain a fibre of high tensile strength, while at the same time maintaining a high speed of travel.

8 Claims, 1 Drawing Figure

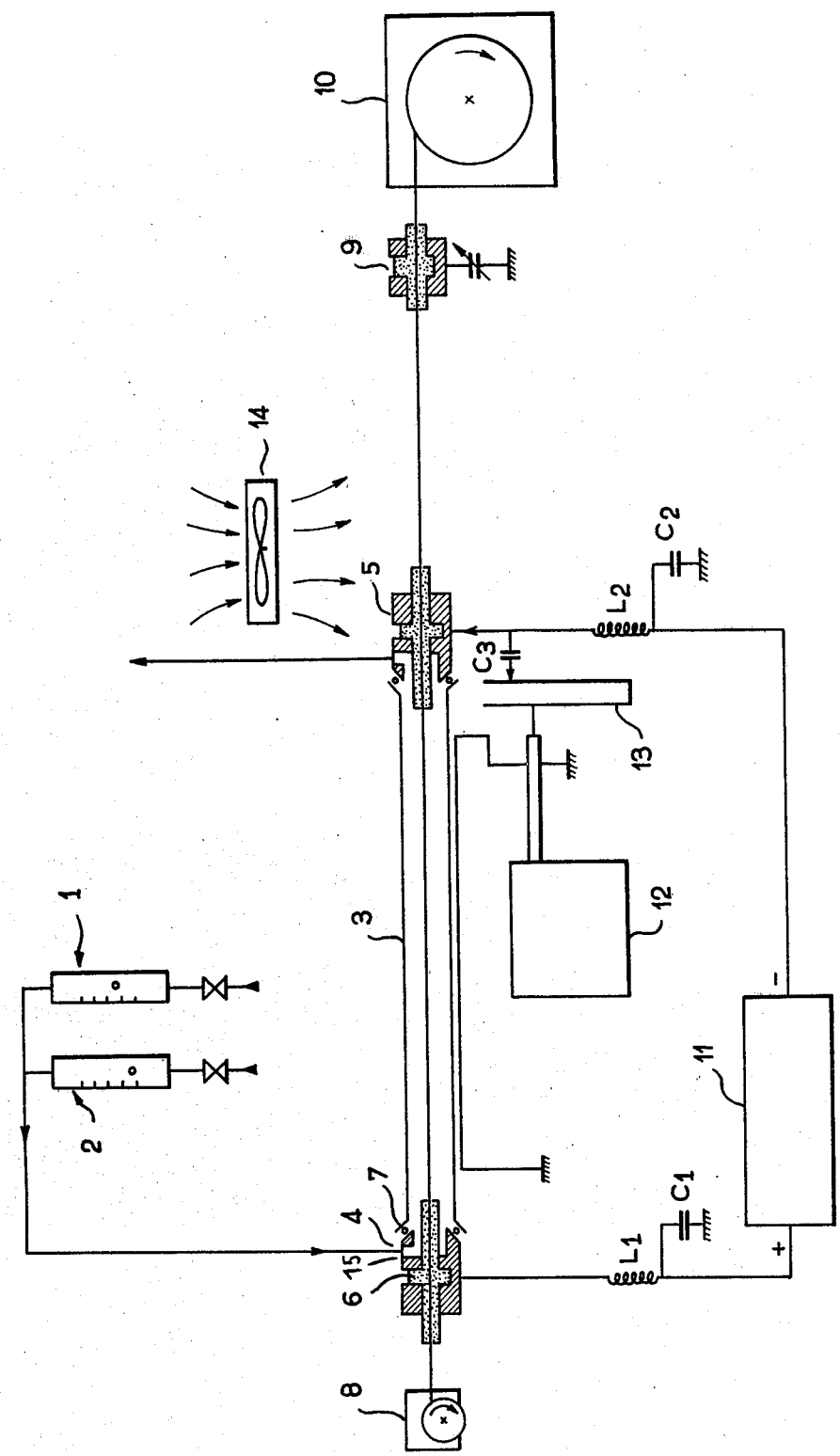

PROCESS AND APPARATUS FOR MANUFACTURING FILAMENTS OF A REFRACTORY MATERIAL BY HIGH-FREQUENCY HEATING

The present invention relates to a process and an apparatus which make it possible continuously to deposit refractory materials, in particular boron, onto a conductive filament heated by means of the Joule effect and by means of a high-frequency current.

It is known to use a process which consists in passing a conductive filament, referred to as the substrate and heated by means of the Joule effect, through a cylindrical reaction chamber arranged horizontally or vertically; the reaction chamber is provided with an inlet device and an outlet device, which are provided with a conductive gasket permitting the introduction of the gaseous mixture and providing a seal against the external atmosphere and ensuring the passage of the electric current required for heating by means of the Joule effect. In the case of the deposition of boron, the gaseous mixture is generally composed of boron trichloride and hydrogen. In that case, the reaction proceeds in the following manner:

$$2BCl_3 + 3H_2 \rightarrow 2B + 6HCl$$

However, this process exhibits certain disadvantages because the temperature at which the filament is heated decreases substantially over the entire length of the reactor in the direction of travel of the substrate. This has the adverse consequence of causing the rate of deposition of the refractory material onto the conductive filament to vary in the same way (to decrease).

Thus, the temperature of the filament, which is usually 1,100° to 1,250° C. at the inlet of the reactor, changes to 950° C.–1,000° C. at the outlet of the reactor. Thus, the rate of deposition, which is 4 to 6 $\mu$m/second at the inlet of the reactor, decreases to less than 1 $\mu$m/second at the outlet of the reactor.

Moreover, the extreme temperature to which the conductive filament can be heated, in this device, is limited by the tendency of the refractory material to crystallise, thus giving a fibre having very poor mechanical properties.

Various solutions have hitherto been proposed for overcoming these disadvantages.

In particular, U.S. Pat. No. 2,656,283 has proposed to divide the reactor into several reaction chambers with separate electrical supplies.

However, such a process leads to a heterogeneity in the deposit and this detracts from the mechanical characteristics of the resulting fibre. Furthermore, the operating difficulties involved in reintroducing the filament, when breakage occurs, limit the profitability of the process.

It has also been proposed to attach a furnace around the reactor in order to limit the heat losses by progressively reheating the gases towards the outlet of the reactor. This process is described, in particular, in French Pat. No. 2,170,952. However, the industrial application of such a process is again rendered difficult because of the poor stability of the system. In fact, the reheating of the gases produces a deposit of boron or other refractory materials on the walls of the reactor, thus causing a change in the thermal characteristics, such as the emissivity and the conductivity. Moreover, this process again presents certain difficulties involving the reintroduction of the filament, because of the high temperature of the walls of the reactor.

Furthermore, U.S. Pat. No. 3,811,940 has proposed to use a system of heating by means of one or more high-frequency cavities. However, this device exhibits certain disadvantages. In fact, it is very difficult to achieve a stable coupling between the fibre and the high-frequency cavity because the dimensions of the filament are small in comparison with those of the cavity. This leads to the use of cavities with a very high overvoltage factor, which have stable and precise geometrical characteristics.

Furthermore, the system has a low stability because the introduction of the starting filament, the increase in the diameter of the fibre and the thermal expansions affect the tuning of the cavity and necessitate constant readjustment. The use of a cavity with a very high overvoltage factor also makes it necessary to work with large high-frequency voltages and thus increases the losses and the stray radiation. Moreover, the adjustment of such a cavity is difficult and any displacement of the intensity maximum leads to overheating of the filament and poor mechanical properties.

It has now been found that the combination of heating by means of the Joule effect and high-frequency heating with the aid of a novel device makes it possible to overcome the above disadvantages.

The object of the present invention is thus to make it possible to obtain a uniform deposit of boron or other refractory materials on the conductive filament and, at the same time, considerably to increase the diameter of this filament, whilst at the same time increasing the tensile strength of these filaments.

A further object of the present invention is to make it possible to increase the heating power without thereby causing a deterioration in the mechanical properties of the resulting filament.

According to the present invention, the process for continuously depositing refractory materials, in particular boron, from a gaseous mixture, decomposable by pyrolysis, onto a conductive filament heated by means of the Joule effect, the said filament travelling through a tubular reactor, is characterised in that the conductive filament is also heated selectively by means of a high-frequency current.

In the description which now follows, the term conductive filament indiscriminately denotes both the filament which is covered by the refractory material during its passage through the reactor and the filament which has not yet been covered, at the moment of its introduction into the reactor.

In fact, it is obvious to those skilled in the art that the electrical contact is established on the conductive filament which has not been covered with refractory material, at the inlet of the reactor, and on this same filament when it has been covered, at the outlet of the reactor.

In accordance with a general procedure, the conductive filament is drawn at a constant speed through a tubular reaction of given length, in which a reactive gaseous mixture circulates.

The seal for the device is provided by means of two pipettes filled with a conductive liquid of high surface tension, for example mercury. Heating is effected by means of two devices in combination:

1. by means of a high-voltage direct current supply which can be adjusted according to the substrate used and the length of the reactor; and 2. by means of a high-frequency current produced with the aid of a generator, the said current being injected directly onto the filament and making it possible selectively to increase the temperature in the chosen part of the reactor.

The term "inject" is understood as meaning that the high-frequency current is transmitted to the conductive filament.

The length of the reactor depends on the wavelength of the high-frequency current used. It is generally acknowledged that a reactor length of between $\lambda/2$ and $\lambda/4$ is particularly suitable for high-frequency heating.

The range of wavelengths used can vary within wide limits. Wavelengths varying between 10 m and 1 m are preferably used.

The conductive substrate can be made of any of the materials conventionally used as a substrate for the deposition of a refractory material. Tungsten, titanium, zirconium, carbon, iron, steel, molybdenum and nickel may be mentioned by way of indication.

Silicon carbide or titanium diboride may be mentioned as examples of other refractory materials apart from boron.

Usually, the deposition temperature, that is to say the temperature at which the filament is heated, is between 950° C. and 1,250° C.

According to a preferred process, it has been found that the total heating power used, that is to say the power corresponding to the sum of the direct-current power and the high-frequency power, is advantageously greater than the maximum power which can be used with the conventional direct-current process, which is of the order of 180 W for a reactor of length 50 cm. This power increase makes it possible to increase the diameter of the filament and its mechanical tensile strength, compared with the process using direct-current heating. The increase in the power injected can thus be of the order of 80%, leading to a doubling of the mass of boron deposited.

According to another preferred embodiment, the temperature is advantageously varied in an increasing and continuous manner from the inlet to the outlet of the reactor.

The consequence of this particular embodiment is that the filament obtained possesses a much greater tensile strength than that obtained by the conventional process and this is achieved with higher production speeds.

Moreover, the fact that the first stage of the deposition is carried out at a low temperature makes it possible to limit the tendency to deposit crystals, the number of defects at the refractory substance/substrate interface and the associated stresses.

It is thus possible to deposit boron or other refractory materials from raw materials of poorer quality than those required for the conventional process, and thus to reduce the manufacturing costs without adversely affecting the mechanical properties.

It has been found that it is particularly advantageous to inject the high-frequency current at the outlet of the reactor, preferably at the level of the outlet member of the reactor, in order to increase the temperature of the filament in the second part of the reactor.

The present invention also relates to an apparatus which makes it possible to carry out the deposition of refractory materials, in particular boron, from a gaseous mixture, decomposable by pyrolysis, onto a conductive filament heated by resistance, the said apparatus consisting of a tubular reaction chamber, of closing means at the two ends of the chamber, the said means functioning in accordance with the principle of capillarity in order to produce a seal and at the same time an electrical contact for the purpose of heating, of an inlet means for supplying the reactive gaseous mixture to the chamber, and of an outlet means for discharging the by-products and the excess reacting gas, and being characterised in that the said device is combined with a high-frequency heating means coupled directly to the conductive filament.

In general, the closing means at each end of the reactor comprise a part forming a plug or gasket, which has a liquid compartment filled with a conductive fluid having characteristics of high surface tension, preferably mercury, each liquid compartment terminating in a restricted orifice so as to produce an opening (that is to say an orifice, a slot or the like) which is sufficiently wide to allow a filament to pass through continuously, but which is sufficiently small to limit the passage of the conductive fluid present in the liquid compartment. In the case of the outlet plug, the opening must be sufficiently wide to allow the covered filament to pass through.

The tubular reaction chamber is made, for example, of glass.

The inlet and outlet means for the reactive mixture preferably consist of tubes inserted in the closing means, which pass through the latter as far as the reaction chamber.

The high-frequency current is advantageously injected onto the filament via the closing means associated with a device which is connected to earth via a capacitive system and which is located at such a distance from the point where the high-frequency current is injected that it makes it possible to avoid any escape of the high-frequency energy towards the winding device.

The high-frequency current produced by the high-frequency heating means can be injected at any point on the conductive filament by making a hole in the reactor and using this hole to insert a contact connected to the filament.

However, it is particularly advantageous to inject this high-frequency current at the outlet of the reactor at the level of the closing means. In fact, this makes it possible considerably to improve the heating of the filament in the second part of the reactor. Other advantages of this embodiment will be understood more clearly with the aid of the examples which are to be found at the end of this description. The description which is now given with reference to the attached FIGURE, by way of a non-limiting example, will provide a clear understanding of how the invention can be put into effect. Of course, the particular characteristics which become apparent both from the FIGURE and from the text form part of the present invention.

The attached FIGURE is a sectional view of an embodiment of the apparatus which is particularly suitable for use in putting the invention into effect.

According to the attached FIGURE, the apparatus consists of:

a system for dispensing the reactive $H_2/BCl_3$ mixture, comprising two flowmeters (1) and (2) with respective capacities of 600 liters/hour and 300 liters/hour for hydrogen and boron trichloride;

a glass reactor (3), the length of which is preferably between $\lambda/2$ and $\lambda/4$, $\lambda$ being the wavelength emitted by the high-frequency generator; the reactor is screened over all or part of its length;

two blocking members (4) and (5) made of conductive metal, each possessing a cavity (6) filled with mercury and blocked by means of two members provided with dies made of ruby, diamond or any other suitable material, which allow the fibre to pass through and prevent the liquid from flowing through; an O-ring (7) makes it possible to provide a seal; the members (4) and (5) are held in position with the aid of insulating supports; a cavity (5) makes it possible to introduce or discharge the reactive mixture;

a device (8) for unwinding the conductive filament, making it possible to maintain a constant mechanical tension of 0.5 to 5 gf with the aid of an electric brake;

a member (9), similar to (4) and (5), connected to earth via a capacitive system, located at a distance of the order of $\lambda/4$ from the outlet member and making it possible to prevent the high-frequency energy from escaping towards the winding device;

a winding system (10) making it possible to draw the fibre through the reactor at a constant speed;

a high voltage generator (11) which can be adjusted between 0 and 2,500 V and is capable of supplying an intensity of 250 to 350 mA; the coupling to the members (4) and (5) is effected via two chokes (L1) and (L2) and two shunt capacitors $C_1$ and $C_2$ (1,000 pf/6 KV) in order to prevent the high-frequency energy from returning to the direct-current generator;

a high-frequency generator (12) having a power of 50 to 350 W and a frequency which is such that the length of the reactor is between $\lambda/4$ and $\lambda/2$;

a matching system (13) consisting of a folded line having a length adjustable between 0.1 and 1.2 $\lambda/4$, which makes it possible to match the output of the low-impedance generator ($r=50\Omega$) to the load represented by the line; an isolation capacitor $C_3$ of 1,000 pf/6 KV isolates the high-frequency supply from the direct current; and a ventilation system (14) making it possible to prevent excessive heating of the mercury and of the fibre at the outlet of the reactor.

The following examples illustrate the invention.

EXAMPLE 1

An operation is carried out in the following manner:
flow rate of $H_2=300$ liters/hour, flow rate of $BCl_3=170$ liters/hour
substrate: tungsten of diameter 12.7 $\mu$m
reactor: length 55 cm
speed of travel: 75 m/hour
frequency of the high-frequency current: 144 MHz The following series of experiments was carried out in order to demonstrate the possibility of increasing the total heating power with an increase in the high-frequency energy. The high-frequency power is varied from 0 to 225 W and the direct-current power from 180 to 124 W, and the following results are obtained:

| Direct-current power | 178 W | 150 W | 136 W | 124 W |
|---|---|---|---|---|
| High-frequency current power | 0 W | 90 W | 140 W | 215 W |
| Total power | 178 W | 240 W | 276 W | 339 W |
| Diameter of the fibre ($\mu$m) | 80 | 95 | 105 | 119 |
| Tensile strength (hb) | 344 | 356 | 339 | 360 |

By adding the high-frequency heating system, the heating power is increased from 178 to 339 W and the diameter of the fibre is increased from 80 to 119 $\mu$m.

EXAMPLE 2

The flow rate of the gases, the substrate, the speed of travel and the reactor remain the same as in Example 1. The ratio of the high-frequency current power to the direct-current power is varied so as to obtain an increase in the temperature of the fibre from the inlet to the outlet of the reactor.

The following results are then obtained:

| Direct-current power (W) | 149 | 103 | 103 | 103 |
|---|---|---|---|---|
| High-frequency current power (W) | 0 | 100 | 150 | 200 |
| Diameter of the fibre ($\mu$m) | 84 | 77 | 90 | 104 |
| Tensile strength (hb) | 344 | 430 | 442 | 429 |
| Temperature profile | decreasing | | increasing | |

The production of an increasing temperature profile along the filament leads to greater tensile strengths than those obtained with a decreasing temperature profile.

For the purpose of enhancing the phenomenon, an experiment is then carried out with a 100 cm long reactor tube in order to enhance the temperature profile under the following conditions:

| High-frequency current power: | 100 W; direct-current power: 180 W | | | |
|---|---|---|---|---|
| Temperature profile: | see below | | | |
| Temperature (°C.) | 1,074 | 1,074 | 1,074 | 1,140 | 1,213 |
| Distance from the inlet member | 20 cm | 40 cm | 60 cm | 80 cm | 90 cm |

A fibre of diameter 107 $\mu$m, with a tensile strength of 470 hb, is then obtained. Thus, with a very low temperature in the first part of the reactor, the fibre obtained has a substantially greater mechanical strength than that obtained by the conventional process.

EXAMPLE 3

The conditions are the same as in Example 1, except that the reactive mixture contains impurities, such as $COCl_2$ and $CCl_4$, which limit the mechanical properties of the fibre produced by the conventional system.

| Direct-current power (W) | 178 | 136 | 112 |
|---|---|---|---|
| High-frequency current power (W) | 0 | 140 | 170 |
| Diameter of the fibre ($\mu$m) | 80 | 105 | 98 |
| Tensile strength (hb) | 230 | 339 | 361 |

It is thus possible to manufacture the fibre, with the high-frequency heating system, by using raw materials which cannot be used with the conventional process.

We claim:

1. Process for continuously depositing a refractory material, in particular boron, from a gaseous mixture, decomposable by pyrolysis, onto a conductive filament which consists of advancing said conductive filament through a tubular reactor, heating said filament by means of the Joule effect, selectively heating said conductive filament by means of a high-frequency current and directly injecting onto the filament said high-frequency current.

2. Process according to claim 1 wherein said high frequency current is injected directly onto the filament at the level of the closing means at the outlet of the reactor.

3. Process according to claim 2 wherein the power produced by the high-frequency current is varied so as to increase the temperature from the inlet to the outlet of the reactor.

4. Process according to claims 1, 2, or 3 wherein the conductive filament is tungsten.

5. A filament of refractory material, in particular boron, prepared by the process of claim 9.

6. Apparatus for depositing a refractory material, in particular boron, from a gaseous mixture, decomposable by pyrolysis, onto a conductive filament, which consists of a tubular reaction chamber, capable of producing by capillarity both a seal and at the same time an electrical contact for the purpose of heating, inlet means for supplying the reactive gaseous mixture to the chamber, an outlet means for discharging the by-products from the pyrolysis and the excess reacting gas and a high-frequency heating means coupled directly to the conductive filament, wherein the length of the conductive filament within the reaction chamber is between $\frac{1}{4}$ and $\frac{1}{2}$ the wave length of the high frequency power generated by said high frequency generator and the apparatus includes means defining a high frequency ground connection (9) to said conductive filament at a predetermined distance from said outlet means (5), said predetermined distance being about $\frac{1}{4}$ of said wave length and the apparatus comprises an isolation capacitor which isolates the high frequency current from the direct current.

7. Apparatus according to claim 6 wherein the high-frequency heating means is coupled to the conductive filament at the level of the closing means at the outlet of the reactor.

8. The apparatus according to claim 7 wherein the high-frequency heating means is a high-frequency generator of power 50–350 W and low impedance.

* * * * *